United States Patent [19]

Billman et al.

[11] Patent Number: 4,560,218
[45] Date of Patent: Dec. 24, 1985

[54] SOCKET FOR SURFACE MOUNT DIP

[75] Inventors: Timothy B. Billman, King; James R. Coller, Kernersville; Gary R. Marpoe, Jr., Winston-Salem, all of N.C.

[73] Assignee: AMP Incorporated, Harrisburg, Pa.

[21] Appl. No.: 677,154

[22] Filed: Dec. 3, 1984

[51] Int. Cl.⁴ ............................................ H01R 23/72
[52] U.S. Cl. ............................ 339/17 CF; 339/192 R
[58] Field of Search ........ 339/17 CF, 17 LC, 17 LM, 339/17 C, 174, 176 M, 176 MP, 192 R

[56] References Cited

U.S. PATENT DOCUMENTS 3,212,047 10/1965 McDonough ................. 339/17 CF

Primary Examiner—Neil Abrams
Attorney, Agent, or Firm—F. Brice Faller

[57] ABSTRACT

Socket for a surface mount DIP comprises a housing having two rows of elongate contacts in respective apertures extending between package receiving face and opposed mounting face. Apertures intersect channels in sidewalls of nest in package receiving face forming channels which receive feet extending laterally of package. Contacts are formed with leaf springs which engage feet in channels.

8 Claims, 5 Drawing Figures

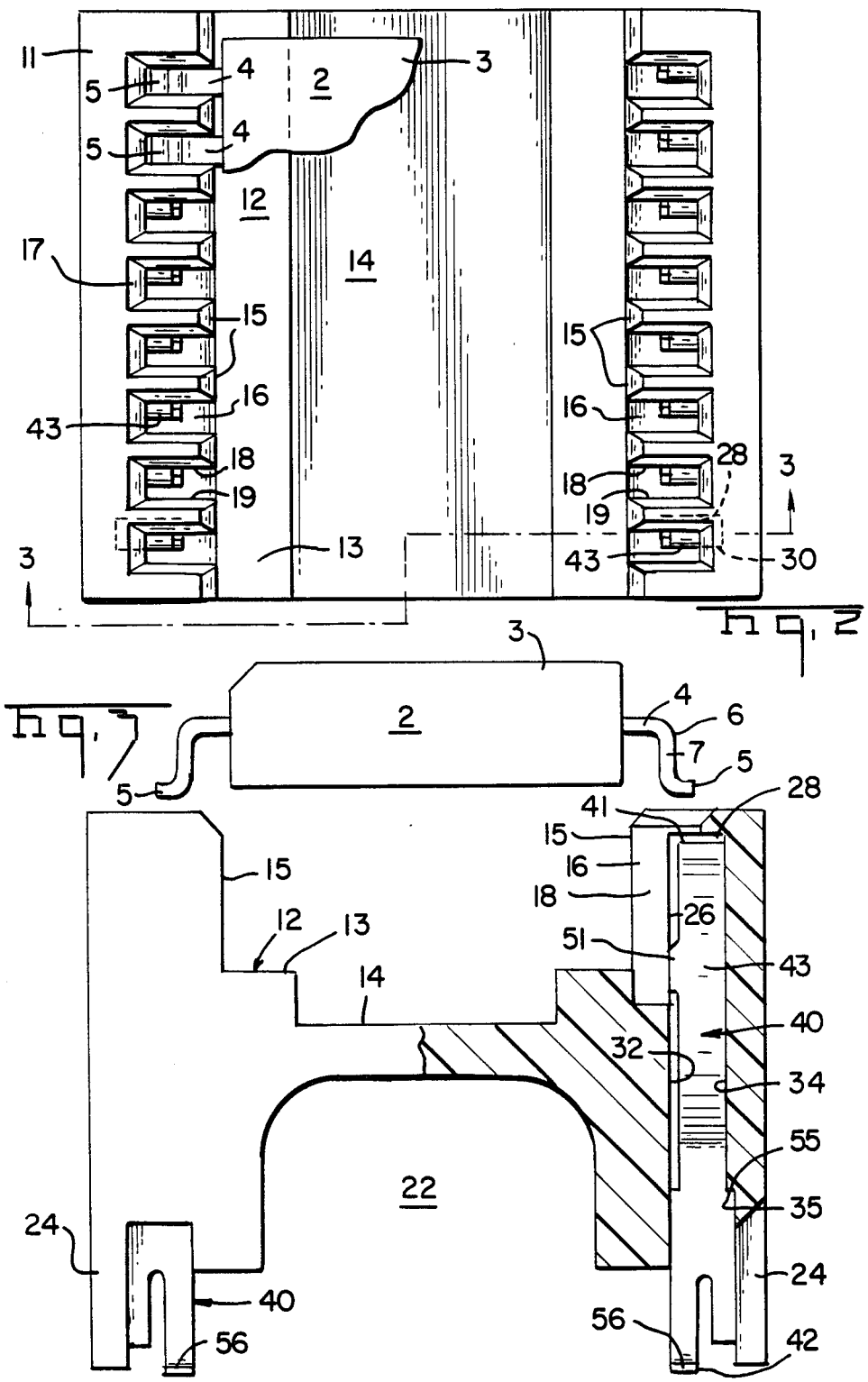

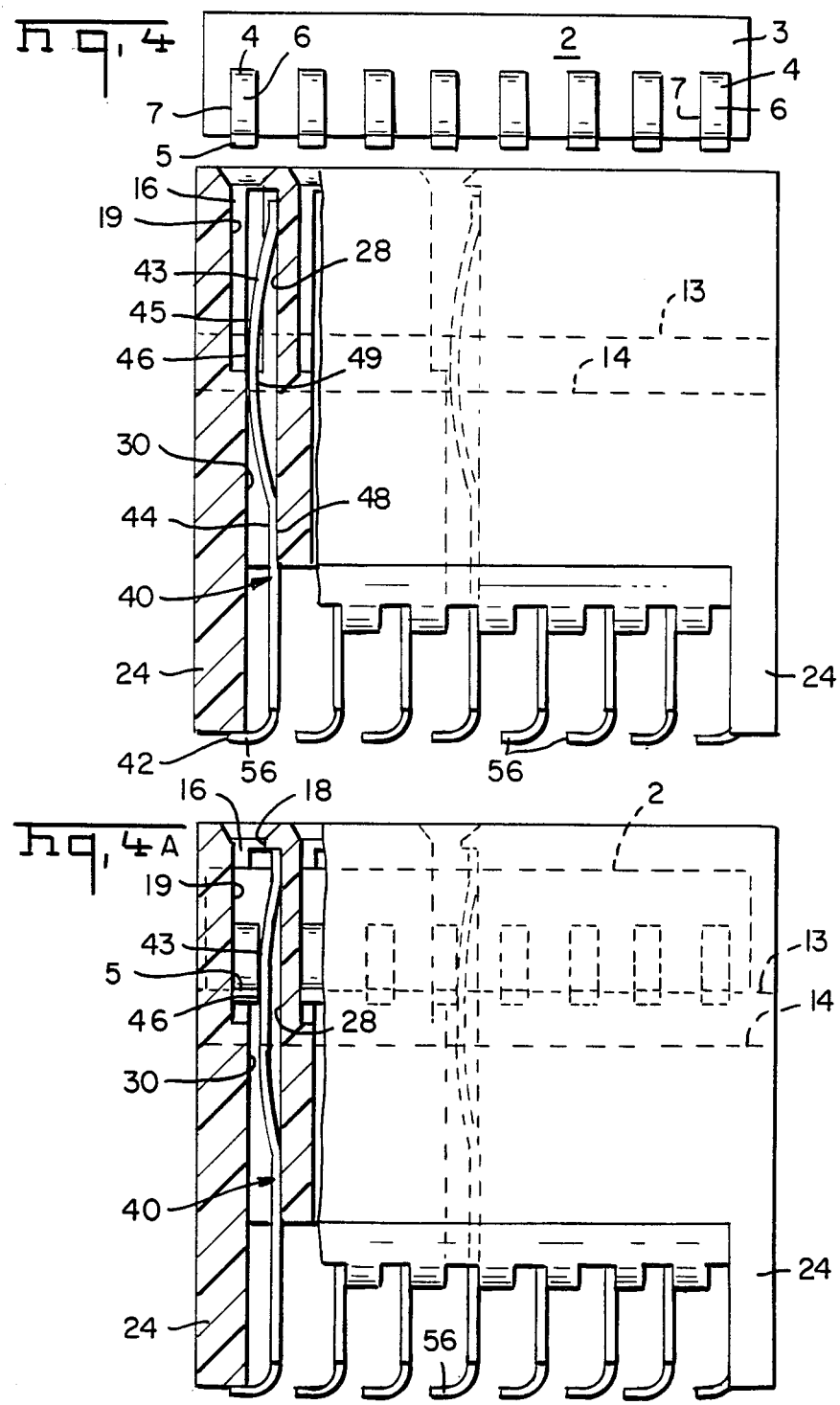

SOCKET FOR SURFACE MOUNT DIP

BACKGROUND OF THE INVENTION

The present invention relates to a socket for a surface mount DIP, also referred to as a small-outline package or SO-package.

Dual-in-line packages, or DIPs, are a standard means for packaging circuit elements such as integrated circuit chips. Each Dip consists of a main plastic body having two rows of leads extending downward therefrom for reception in plated through holes or miniature spring sockets in a printed circuit board (PCB). In order to reduce the possibility of damaging the leads and further to facilitate replacement of the DIP, sockets which are mounted to the board and receive the DIPs therein have been developed. A low profile DIP socket having good contact properties and constant insertion force is disclosed in U.S. Pat. No. 4,060,296.

Some applications require that DIPs be temperature cycled or "burned-in" before end use, to reduce the possibility of failure. For this purpose, sockets comprising housings of temperature resistant material and having contacts offering low insertion force which engage the DIP leads without imposing stress thereon during burn-in have been developed. One such socket is marketed by AMP Incorporated as the DIPLOMATE HT (high temperature).

Recently, small outline packages have been developed. These are DIPs having opposed rows of leads formed with laterally projecting feet for soldering to surface pads on a PCB. As with standard DIPs, some applications such as "burning-in" require sockets from which the SO-package can be readily removed. Sockets for standard DIPs have contacts for receiving downward projecting leads and are quite unsuitable for engaging laterally projecting feet.

THE INVENTION

The present invention is directed to a socket for receiving an SO-package, and is particularly suitable for burn-in applications. The socket comprises a dielectric housing having two parallel rows of apertures therethrough which extend between a board mounting face and a package receiving face having a package receiving nest therein. The apertures intersect the sidewalls of the nest to form channels therein spaced to receive the feet projecting from an SO-package received in the nest. Each aperture has an elongate stamped and formed contact therein which is bowed intermediate its ends to form a leaf spring which resiliently engages a respective foot in lateral compression against an endwall of the aperture. Once the package is inserted in the nest, therefore, there is no stress on the leads excepting minor compressive forces across individual feet. This is particularly advantageous for burn-in applications, where the combination of residual stress and high temperature can be fatal to the structure.

The inventive socket also offers economy of manufacture. The contacts are the product of simple forming operations, and are received in the apertures from the mounting face until barbs or the like engage the housing for retention.

The contacts are formed with respective feet which lie against the mounting face in the same pattern as the mounting feet extending laterally of the SO-package, whereby the socket may be directly substituted for the directly mounted DIP where space limitations permit.

THE DRAWING FIGURES

FIG. 2 is a top view of the socket.

FIG. 3 is an end section view of the socket, taken along line 3—3 of FIG. 2, with the package poised for insertion.

FIG. 4 is a cutaway side view of the socket with the package poised for insertion.

FIG. 4A is a partial cutaway side view of the socket with the package in place.

THE DISCLOSED EMBODIMENT

Figure 1:
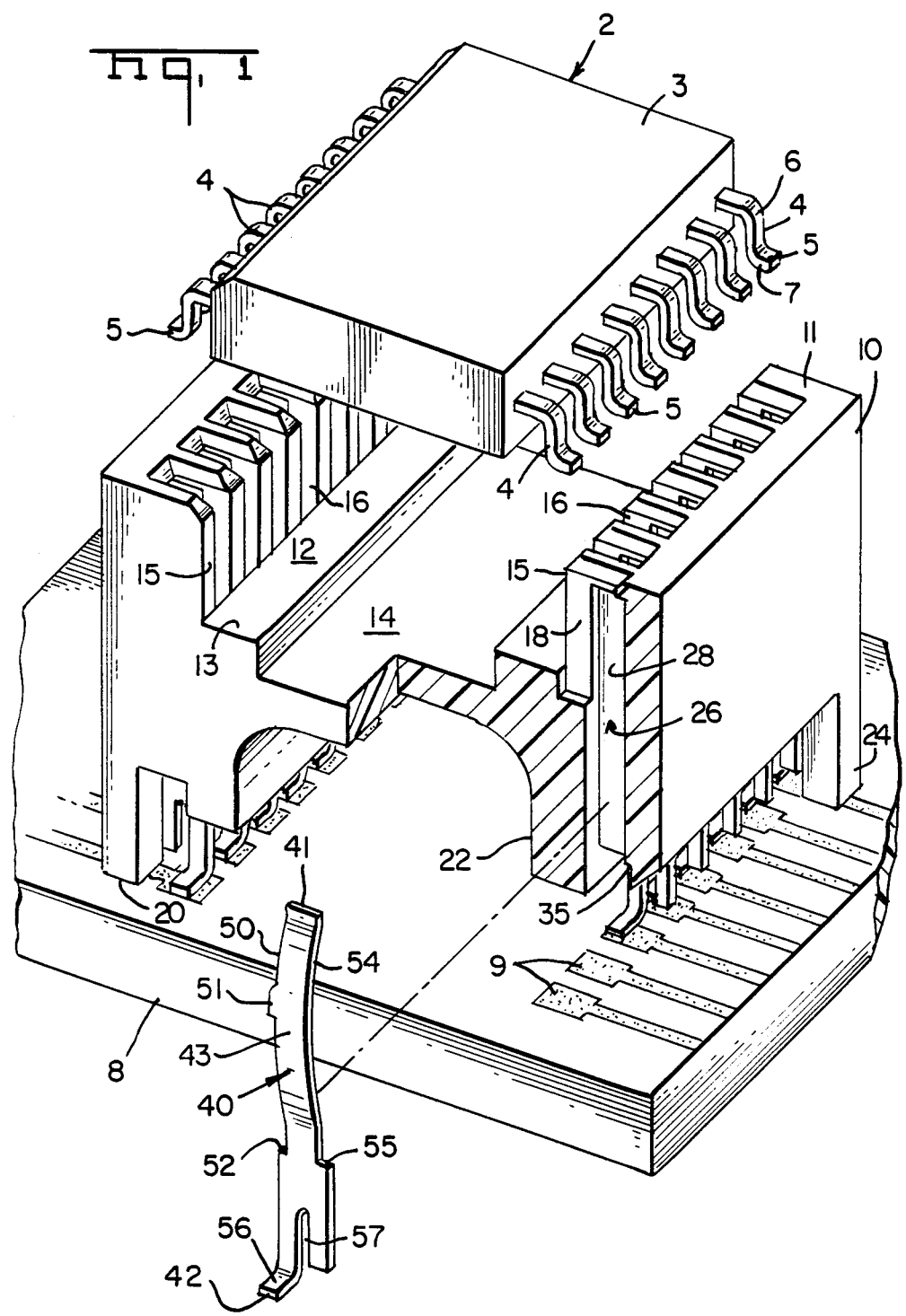
FIG. 1 is a cutaway perspective of the socket with a contact exploded therefrom.

Referring to FIG. 1, the socket of the present invention is shown mounted on a printed circuit board 8 with an SO-package 2 exploded therefrom. The package 2 comprises a plastic body 3 in which an IC chip or other components are encapsulated, the body 3 having two rows of external leads 4 extending from opposite sides thereof. The leads 4 in each row are spaced about 0.050 in. between centers and are formed with feet 5 for soldering against pads where direct mounting is desired. Each lead 4 is stamped and formed from sheet metal and has rolled surfaces 6 and sheared surfaces 7. Note that the lead frames may also be etched from sheet stock, so it should be understood that the term "sheared surfaces" as used herein may also refer to etched surfaces.

The socket comprises a dielectric housing 10, molded of temperature resistant plastic such as polyphenylene sulfide, and two rows of contacts 40 stamped and formed from metal sheet stock such as beryllium copper. Each housing 10 has a package receiving face 11, an opposed mounting face 20, and two parallel rows of contact receiving apertures 26 extending therebetween. The face 11 has a package receiving nest 12 therein defined by parallel opposed sidewalls 15 and a floor 13 having a sword slot 14 therein which facilitates removal of the package 2. The sidewalls 15 are profiled with channels 16 which intersect respective apertures 26. Each aperture 26 has an endwall 28 against which a contact 40 is seated; a contact 40 is shown spaced outward therefrom for clarity. Supports 24 at the four corners of face 20 position the housing 10 against PCB 8.

Referring still to FIG. 1, each contact 40 has a first end 41, a second end 42, and a leaf spring 43 formed therebetween. Each contact 40 has opposed sheared edges 50, 54 formed with shoulders 52, 55 respectively; the shoulders 55 engage shoulders 35 in the housing to prevent the end 41 from abutting the end of the endwall 28, which would impede flexure of the leaf spring. Second end 42 is formed as a foot 56 for soldering against surface pad 9 on PCB 8; the feet 56 are exposed between supports 24 to provide access for inspecting solder joints and better cooling during burn-in. The foot 56, profiled by adjacent slot 57, is narrower than the rest of the contact 40 to provide lateral compliance in the plane of the metal. The recess 22 is molded in the housing 10 to enhance cooling and to assure uniform temperature distribution to prevent cracking during burn-in.

FIG. 2 is a top view of the socket with part of a package 2 shown inserted. Mating face 11 is interrupted by package receiving nest 12 defined by sidewalls 15 having channels 16 therein having chamfered lead-ins 17 and opposed endwalls 18, 19. Only the leaf spring 43 of each contact 40 lying in respective apertures 26 is visible; the springs 43 abut respective endwalls 30 of apertures 26 until deflected by feet 5 of an inserted package.

FIG. 3 shows an SO-package 2 poised for insertion in nest 12; the leaf springs 43 are located to engage sheared surfaces 7 of feet 5 when the body 3 contacts floor 13. Each aperture 26 is profiled by parallel opposed sidewalls 32, 34 which generally parallel the sidewalls 15 of the nest. The contact 40 is received between sidewalls 32, 34 in an interference fit toward face 20; wing 51 adjacent leaf spring 43 serves to provide additional contact surface for a foot 5 on a lead 4.

FIG. 4 is a cutaway side view of the socket with package 2 poised for insertion thereabove. The leaf spring 43 is formed with a convex surface 45 on one rolled surface 44 of contact 40, facing endwall 30, and a concave surface 49 on the opposed rolled surface 48, facing endwall 28. The apex 46 of convex surface 45 is loaded against endwall 30, which assures that opposed rolled surface 48 toward ends 41, 42 will lie against endwall 28. This positioning is achieved during insertion of the contacts 40 in respective apertures 26. When a foot 5 is received in channel 16, the leaf spring 43 will resile as shown in FIG. 4A to force the foot 5 against the opposed endwall 19 of the channel 16. The sheared surfaces 7 on opposed edges of each foot 5 are thus subjected to compressive forces when the package 2 is emplaced, while there are no other residual stresses on the leads 4, and likewise no residual stresses imposed on the body 3. The only stresses imposed thereon are during insertion, when the package is cold and less subject to damage. Note in FIG. 4 that each contact 40 may undergo slight lateral flexure at foot 56 and further may undergo slight axial movement or expansion relative to the housing 10. This provides two additional axes of compliance in addition to that already described, assuring that variations in tolerances and expansion rates will not impose undue stress on the solder joints or elsewhere during burn-in.

We claim:

1. A socket for an integrated circuit package of the type having two opposed rows of leads formed with laterally projecting feet for mounting against surface contacts on a printed circuit board, said socket comprising a dielectric housing having a package receiving face and an opposed board mounting face with two parallel rows of apertures extending therebetween, the package receiving face having therein a package receiving nest having a floor flanked by parallel opposed sidewalls, the sidewalls of the nest having respective parallel rows of channels therein, each aperture having a pair of opposed sidewalls paralleling the sidewalls of the nest and a pair of opposed endwalls substantially perpendicular thereto, the apertures in each row intersecting respective channels, a row of said channels being spaced to receive said feet when said package is placed in said nest, a plurality of elongate formed contacts lying in respective apertures, each contact having first and second sheared surfaces facing respective sidewalls of the aperture and opposed first and second rolled surfaces facing respective endwalls thereof, each contact having a first end proximate said package receiving face and an opposed second end formed with a foot proximate the mounting face, each contact being bowed intermediate said ends to form a leaf spring having a convex surface and a concave surface, which face respective opposed endwalls, the apex of the convex surface being located so that the leaf springs resiliently engage the feet of the package leads in the channels when the package is inserted in the nest.

2. A socket as in claim 1 wherein said leads are stamped and formed from sheet metal, each lead having opposed first and second sheared surfaces facing respective second and first sheared surfaces of adjacent leads.

3. A socket as in claim 1 wherein the feet of the contacts in the socket form an array substantially like the array of feet on the leads extending from the integrated circuit package.

4. A socket as in claim 1 wherein the contacts are received in the housing from the mounting face and have an interference fit between portions of the opposed sheared surfaces and the adjacent sidewalls of respective apertures.

5. A socket as in claim 1 wherein the apex of the leaf spring lies in the aperture immediately below the channel and is positioned to bear against the foot of a package inserted in the nest.

6. A socket as in claim 1 wherein each channel is offset from the aperture which it intersects, the channel being offset away from the endwall facing the concave surface of the leaf spring, the endwall facing the convex surface of the leaf spring intersecting the channel.

7. A socket as in claim 1 wherein the aperture stops short of the package receiving face of the housing, whereby the first end of the contact is not exposed thereat.

8. A socket as in claim 7 wherein the first end of the contact is spaced from the end of the aperture when the spring is undeflected.

* * * * *